United States Patent [19]

Ferro et al.

[11] 4,012,761
[45] Mar. 15, 1977

[54] SELF-PROTECTED SEMICONDUCTOR DEVICE

[75] Inventors: Armand P. Ferro, Schenectady; Victor A. K. Temple, Elnora, both of N.Y.

[73] Assignee: General Electric Company, Schenectady, N.Y.

[22] Filed: Apr. 19, 1976

[21] Appl. No.: 677,876

[52] U.S. Cl. .................. 357/38; 357/13; 357/20; 357/30; 357/68
[51] Int. Cl.² .................. H01L 29/74
[58] Field of Search .......... 357/20, 38, 39, 30, 357/13, 68

[56] References Cited

UNITED STATES PATENTS

| | | | |
|---|---|---|---|
| 3,408,545 | 10/1968 | DeCecco et al. | 357/38 |
| 3,440,501 | 4/1969 | Piccone et al. | 357/38 |
| 3,476,989 | 11/1969 | Miles et al. | 357/38 |
| 3,590,346 | 6/1971 | Bilo et al. | 357/38 |
| 3,622,845 | 11/1971 | McIntyre et al. | 357/38 |
| 3,893,153 | 7/1975 | Page et al. | 357/38 |
| 3,968,512 | 7/1976 | Voss | 357/38 |

FOREIGN PATENTS OR APPLICATIONS

| | | | |
|---|---|---|---|
| 47-22429 | 6/1972 | Japan | 357/38 |

OTHER PUBLICATIONS

J. Garrett, "The Evolution of a High–Power Fast–Switching Thyristor," Electrical Engineer, vol. 48, No. 5, May 1971, pp. 33–35.

*Primary Examiner*—Michael J. Lynch
*Assistant Examiner*—Joseph E. Clawson, Jr.
*Attorney, Agent, or Firm*—Stephen B. Salai; Joseph T. Cohen; Jerome C. Squillaro

[57] ABSTRACT

A self-protected thyristor structure is provided having an auxiliary gate region peripherally located with respect to the semiconductor device so as to provide for the controlled turn-on of the device at the edge thereof in response to increasing edge current densities at the onset of avalanche breakdown. An auxiliary pilot thyristor is provided substantially surrounding the main thyristor structure and including an annular gate electrode surrounding the auxiliary pilot thyristor structure to insure that turn-on occurs substantially simultaneously throughout the extent of the pilot thyristor region.

14 Claims, 4 Drawing Figures

SELF-PROTECTED SEMICONDUCTOR DEVICE

This invention relates in general to semiconductor switches and more particularly to self-protected thyristors of the type suitable for controlling the flow of current in a high voltage electrical circuit.

It is a characteristic of semiconductor switches and more particularly of thyristors that they are prone to fail catastrophically upon the application of a voltage thereto in excess the breakdown voltage. This is due in large measure to the unpredictability of the behavior of the devices on a microscopic scale. The larger a physical device, the greater the possibility for localized inhomogeneity in the crystal semiconductor structure thereof. It is therefore a common practice to provide protective means closely associated with such semiconductor devices for preventing the destruction of the devices by overvoltage breakdown. It has been common practice to provide for the protection of thyristor devices by inserting in parallel with the anode and gate terminals thereof a secondary device having a predictable voltage breakdown characteristic such that current will flow therein at a voltage which is less than the breakdown voltage of the main device. In this way, a thyristor device will be caused to turn on by the application of a gate signal thereto at a voltage lower than the voltage which would otherwise cause the destruction of the device. This type of protection while in many ways effective, suffers from several limitations which the instant invention overcomes. For example, since the main device and protective devices are practically, if not necessarily fabricated independently, it is often the case that they will have different and independent tolerances. It is often times necessary, therefore, to provide a breakdown voltage in the protective device which is somewhat lower than would be desired in an ideal case. This allows for variations both in the protected device and in the protective device. It is not uncommon to find thyristor devices of the type to which this invention is addressed being provided with external protective circuitry which reduces the maximum potential applicable thereto by as much as a third. In this way it can be predicted almost to a certainty that the protected device will be turned on by the protective device before destruction due to overvoltage can occur. It is clearly undesirable to sacrifice high voltage breakover characteristics in this manner unless absolutely necessary. Further, external protective circuitry is often times expensive, both to fabricate, and in the increased complexity attendant to the application of the protective circuitry to the protected devices.

It has been suggested, for example, by Voss, P., *Solid-State Electronics*, 1974, Vol. 17, pp. 655 through 661, that protection may be achieved within a device through the expedient of doping the n-base of an amplifying or pilot thyristor to a higher concentration than the n-base of the main thyristor. This decreases the breakdown voltage of the pilot thyristor of the device and is said to insure that turn-on will occur in the pilot thyristor region. A technique of this type for providing a self-protecting thyristor structure suffers from the disadvantage that it is difficult to implement. At the very least, an additional processing step is required to increase the donor concentration in the gate region of the pilot thyristor of the device. At worst, a device in accordance with the teachings of Voss might require entirely different processing technology to implement and, therefore, represent an increase in cost in excess of that which would be tolerable in order to obtain the advantages, if any, provided.

It is an object of this invention to provide a self-protected thyristor structure requiring no additional external components beyond the thyristor itself.

It is a further object of this invention to provide a self-protected thyristor structure wherein the main thyristor and the protective portion thereof are fabricated at the same time thereby enabling more precision to be obtained in matching the two portions of the device.

It is a further object of this invention to provide a self-protected thyristor structure which may be fabricated utilizing the same process steps required for an unprotected thyristor.

It is yet another object of this invention to provide a self-protected thyristor structure which may be produced for substantially the same cost as a unprotected structure.

Briefly stated, and in accordance with one aspect of this invention, a self-protected thyristor structure is provided having an auxiliary gate region peripherally located with respect to the semiconductor device so as to provide for the controlled turn-on of the device at the edge thereof in response to increasing edge current densities at the onset of avalanche breakdown. In accordance with a presently preferred embodiment of this invention an auxiliary pilot thyristor is provided substantially surrounding the main thyristor structure and including an annular gate electrode surrounding the auxiliary pilot thyristor structure to insure that turn-on occurs substantially simultaneously throughout the extent of the pilot thyristor region.

In an alternative embodiment of this invention an auxiliary pilot thyristor is provided at the circumference of a substantially disk shaped semiconductor device having a gate electrode therearound as described hereinabove. Connection is provided between the auxiliary pilot thyristor and the center pilot thyristor of the device in order to provide substantially simultaneous turn-on from both the center and the periphery of the device. Yet another alternative embodiment of this invention provides for a radial connection between the center pilot thyristor and the circumferential auxiliary pilot thyristor by means of one or more metallizations formed integrally with the device. This latter embodiment of the invention provides additional turn-on area and thereby forms a device having many advantages in addition to self-protection from the effects of overvoltage avalanche breakdown.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

Figure 1:
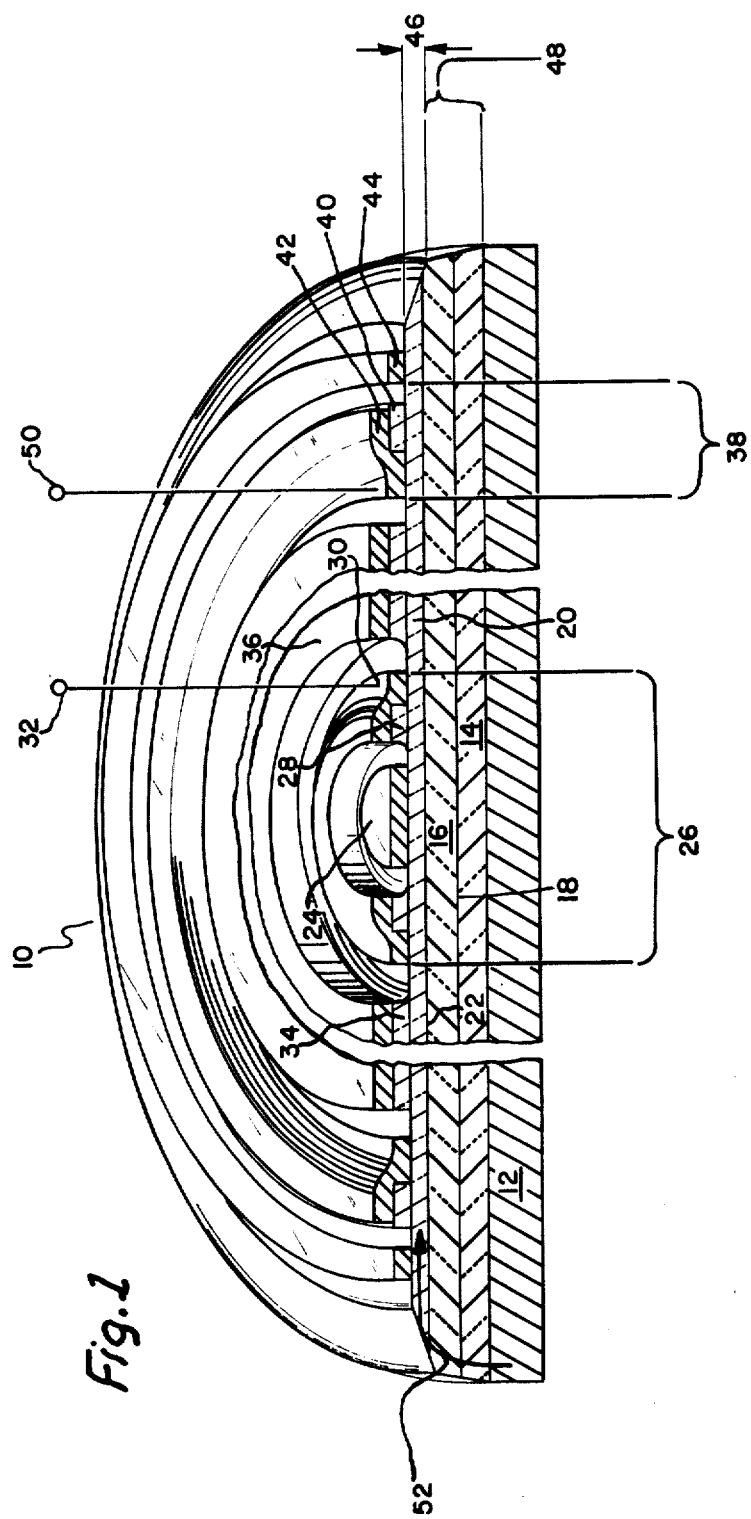
FIG. 1 depicts a self-protected thyristor semiconductor device in accordance with one embodiment of this invention.

The operation and advantages of a self-protected thyristor device in accordance with this invention may be readily understood by referring now to FIG. 1 wherein an exemplary thyristor device including an auxiliary gate at the periphery thereof is illustrated. The device, designated generally at 10, is a four layer thyristor device of substantially disk-shaped configuration. Thyristor 10 is substantially of a type well known to those skilled in the art save only for the addition of an auxiliary gate region thereto in accordance with this invention. A conductive electrical contact 12 is ohmically connected to a p-conductivity type semiconductor layer 14 which forms the anode layer of the device. P-type layer 14 may conveniently be of silicon or, alternatively, any other of the semiconductor materials known in the art. N-type base layer 16 overlies p-type anode layer 14 forming first semiconductor junction 18 therebetween. P-type base layer 20 overlies n-type base layer 16 and forms second semiconductor junction 22 therebetween. The thyristor device described thus far will be appreciated to be conventional in nature and those skilled in the art will readily understand the fabrication and characteristics of the device as hereinabove described. The precise concentrations of the p-base, n-base and anode layer may vary somewhat from device-to-device depending upon the particular characteristics desired. It is emphasized and will be appreciated by those skilled in the art that a device in accordance with this invention has a wide range of applications and may be successfully applied to devices of the general type illustrated but differing in the particular characteristics thereof. Gate electrode 24 overlies p-type base layer 20 and is located substantially in the center of the device. The precise configuration of gate electrode 24 may vary from the generally round shape illustrated herein for purposes of example and, in fact, may be any of the gate structures known in the art. The precise form of gate 24 and associated pilot thyristor region 26 which includes n-type emitter layer 28 and electrode 30 will determine the gate characteristics of the device. Rectangular gates, circular gates, isolated gates, junction gates, light sensitive gate regions and other types of gate structures heretofore known may be appropriately employed in conjunction with any thyristor device in accordance with this invention. The main cathode region contains n-conductivity type emitter layer 34, a generally annular shaped region overlying p-type base layer 20. Cathode metallization 36 ohmically contacts emitter 34 and forms the cathode of the device. While not illustrated, it is to be appreciated that emitter layer 34 and overlying metallization 36 might well be provided with emitter shorts as is well known to those skilled in the art. The presence or absence of such emitter shorts is not a part of this invention except in so far as they may readily be employed as desired to obtain the advantages attendant thereto without effecting the advantages obtained by this invention. However, such shorts would normally be present and situated in such a manner as to make the main emitter region less sensitive to turn-on currents than the pilot and auxiliary pilot thyristor regions.

Auxiliary pilot thyristor region 38 surrounds the main thyristor section including n-conductivity type layer 40 and metallization 42 overlying layer 40. It will be appreciated by reference to device 10 that the orientation of auxiliary pilot thyristor 38 is opposite that pilot thyristor 26. That is to say, that they are mirror images of one another with respect to the main thyristor section of the device. It will be apparent, of course, that the radius of auxiliary pilot thyristor 38 will be greater than that of pilot thyristor 26 since thyristor 38 is exterior to the main thyristor section while thyristor 26 is interior thereto. Auxiliary gate electrode 44 surrounds auxiliary pilot thyristor 38 and overlies p-type base layer 20.

It will be appreciated by further reference to FIG. 1 that thyristor 10 also includes a negatively beveled edge region at the outside of the device. As is well known, the beveling of the edge of a thyristor device reduces the electric field intensity thereat and increases the ultimate breakdown voltage of the device. Device 10 includes a first negatively beveled region 46 and a second region 48 having a different bevel angles. It will be appreciated that in accordance with this invention techniques well known to those skilled in the art for determining the optimum bevel angles may be appropriately utilized.

Auxiliary pilot thyristor 38 is provided with a second electrical contact 50 to metallization 42 thereof.

Upon the application of a voltage between electrode 12 and electrode 36, electric fields are created in the bulk of the semiconductor material. It has been determined as can be readily verified either experimentally or analytically that the maximum electric fields occur near the edge of the device notwithstanding the inclusion thereat of a beveled region as illustrated in FIG. 1. In accordance with this invention, leakage currents which flow as a result of high electric field intensities near the edge of the device are utilized to turn-on the main body of the thyristor in a controlled manner rather than permitted to lead to the destruction of the device as a result of current densities exceeding the capability of the device to dissipate them. In accordance with this invention, it is preferred that the device be so designed with respect to the breakdown voltage thereof that the maximum electrical field be certain to occur at the periphery of the device and in any case outside of the auxiliary pilot thyristor region 38. Even in the presence of device nonuniformities affecting breakdown voltage, this end may readily be accomplished by selection of a larger bevel angle for region 46. Generally, such purposeful lowering of edge region breakdown voltage will not be required. Assume now that current begins to flow as indicated by arrow 52. It will be understood that upon the application of an overvoltage to device 10 current will begin to flow along path 52 and thereafter under auxiliary gate 44, and auxiliary pilot thyristor 38. When the current reaches a sufficient magnitude auxiliary pilot thyristor 38 turns on followed by turn-on of the main thyristor section. This assumes, as is usual with pilot or auxiliary thyristors, that they have a greater turn-on sensitivity than the main emitter region. As is well known, as the main section of thyristor 10 turns on, the resistance thereunder decreases to an extent that the area of the thyristor underlying auxiliary pilot thyristor 38 and auxiliarly pilot gate 44 turns off, the current thereunder diminishing substantially to zero. A self-protecting thyristor in accordance with this invention has the advantage therefore that not only does the initial leakage current at the onset of avalanche breakdown tend to turn on the device, but further the area of initial turn-on is actually turned off as the main body of the device is turned on.

It is another feature of this invention that electrical contacts 32 and 50 may be connected together by any convenient means to yet further increase the turn-on area of the device in the presence of either an external gate signal or an internally generated gate signal due to the onset of avalanche breakdown. Connections 32 and 50 may be electrically connected by any convenient method known to those skilled in the art as, for example, by an external wire or the like. It is, however, advantageous in accordance with this invention to provide a connection of the type illustrated, for example in FIG. 2.

The device, indicated generally at 60, is in many ways similar to the device of FIG. 1 and in conjunction therewith like reference numerals indicate like elements. An electrically conductive base member 12 is provided which is suitable for maintaining thermal and electrical contact with thyristor device 60. A p-conductivity type semiconductor layer 14 overlies base 12 and is in thermal and electrical contact therewith. A second semiconductor layer 16 overlies layer 14 and is of n-conductivity semiconductor material. Layers 14 and 16 form first semiconductor junction 18 therebetween. A second p-conductivity type layer 20 overlies layer 16 forming semiconductor junction 22 therebetween. Layers 16 and 20 may be referred to as the n-base and p-base regions of the thyristor, respectively. Gate electrode 24 is located at the approximate center of the device. Gate electrode 24 is surrounded by pilot thyristor 62. Pilot thyristor 62 includes n-conductivity type annular ring 64 which surrounds gate electrode 24. While n-type annular ring 64, hereinafter referred to as the pilot thyristor emitter, is illustrated in accordance with this invention as overlying p base layer 20, it will be understood pilot emitter 64 might readily be formed by diffusion, in which case it would extend from the surface of p base layer 20 down toward, but not meeting, semiconductor junction 22. The precise construction of pilot thyristor 62 forms no part of this invention, except insofar as described. Metallization 66 overlies emitter layer 64 and provides at the exterior circumference thereof a short to p base 20. Metallization 66 is generally of annular configuration and includes spoke-like projections 68 and 70 extending outward therefrom towards the circumference of the device. While thyristor device 60 is illustrated as having three spoke-like projections extending from metallization 66 out towards the periphery of the device, it will be understood that, in accordance with this invention, the number and shape of projections may be varied without departing from the true spirit and scope thereof. For example, at least one projection must be utilized in accordance with this embodiment of the invention, and it may be desirable to use 2, 3, 4, or more projections in order to increase the turn-on area as will here below described. Projections 68 and 70 intersect and become part of auxiliary pilot thyristor 72. Auxiliary pilot thyristor 72 includes both metallization 74 and n conductivity type pilot emitter layer 76. Metallization 74 overlies n type emitter 76. Pilot thyristor 72 is surrounded at the outside periphery thereof by gate metallization 78 which functions as the gate of the auxiliary pilot thyristor. The main body of thyristor 60 includes n-conductivity type emitter layer 80 and overlying metallization 82 which forms the cathode terminal of the device. It will be appreciated by those skilled in the art that the two power handling connections to the device are made to cathode terminal 82 and to anode metallization 12. Gate connection is made to gate contact 24 for normal triggering of the device.

As was the case in conjunction with the device of FIG. 1, when a voltage is applied between anode 12 and cathode 82, electric fields will be created in the semiconductor layers therebetween, the highest fields generally being found in the edge region of the device exterior to auxiliary gate 78. As the voltage across the device is increased, leakage currents begin to flow, the leakage currents increasing rapidly as the avalanche breakdown voltage of the device is approached. As current flows in p base layer 20 under auxiliary pilot thyristor 72, pilot thyristor 72 tends to turn on. As pilot thyristor 72 turns on, the main emitter is turned on thereby. Since auxiliary pilot thyristor 72 is electrically connected to pilot thyristor 62, the main emitter of the device is turned on substantially simultaneously from both the inner and outer edges thereof. Further, as will be appreciated by reference to the top view of FIG. 2, turn on will also be effected in the area of radially extending projections 68, 69 and 70. It will be appreciated that this larger turn on area will be effected whether the device is triggered by leakage currents flowing at the onset of avalanche breakdown or by an externally applied gate signal applied either to gate 24 or, if desired, to gate 78.

Figure 2:
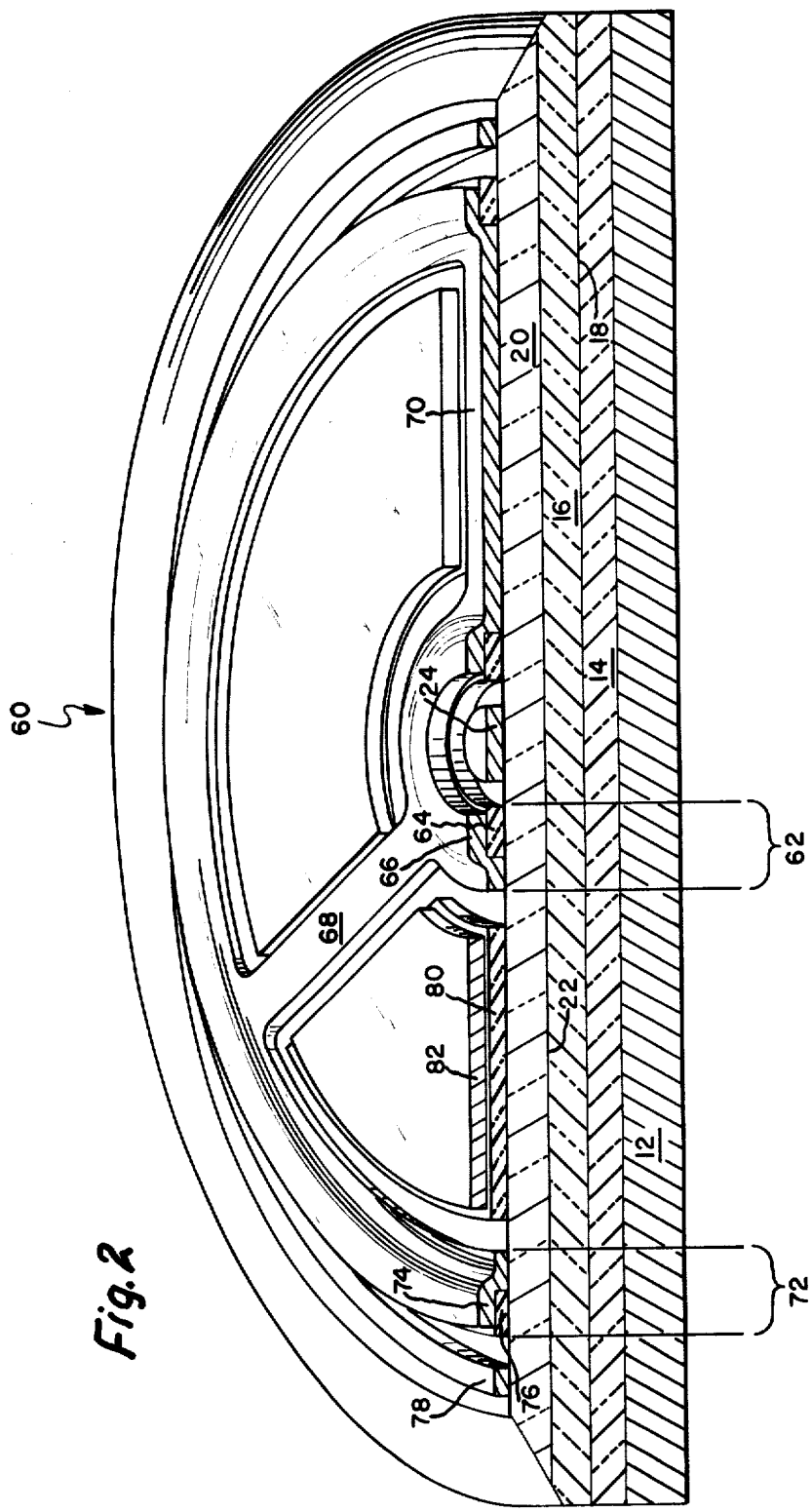
FIG. 2 illustrates a self-protected thyristor in accordance with another embodiment of this invention.

Except for the additional turn on area adjacent projections 68 and 70, the operation of the device of FIG. 2 corresponds to that of the device of FIG. 1 and the discussion in conjunction therewith applies equally to device 60.

Figure 3:
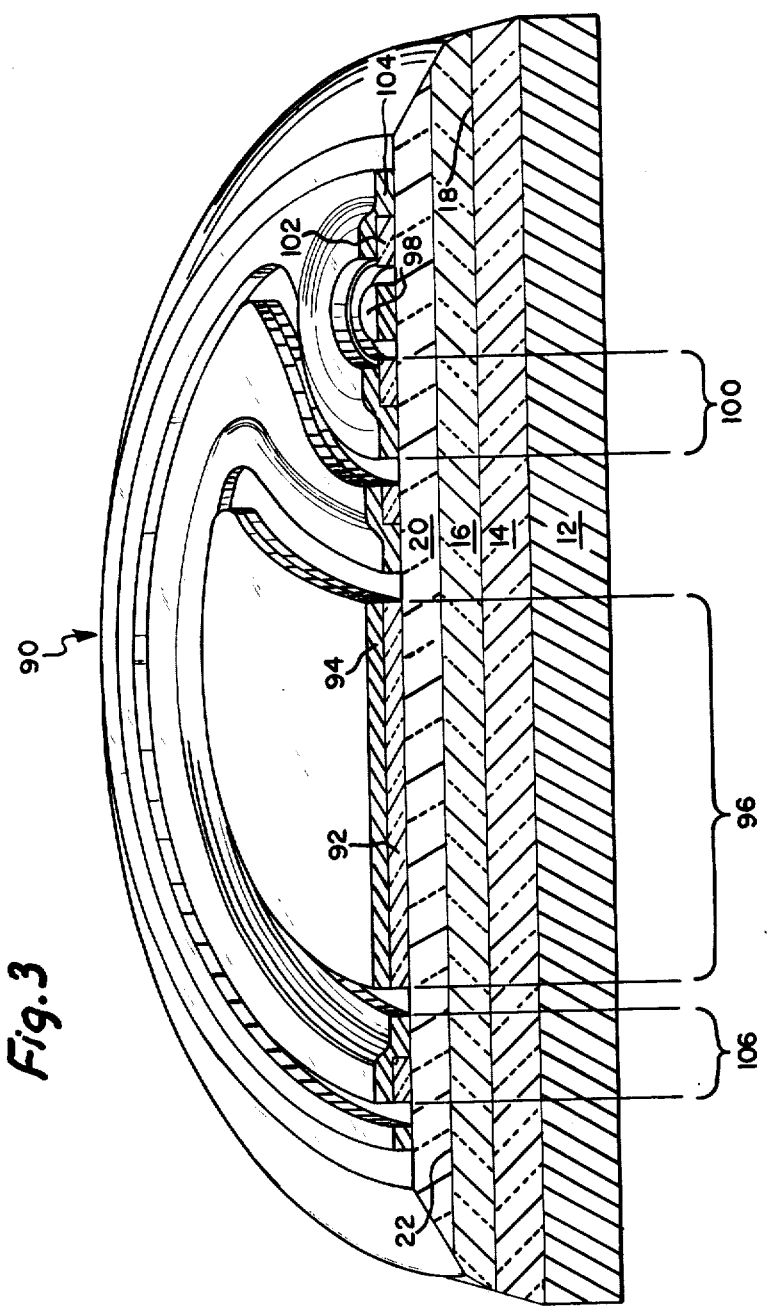
FIG. 3 illustrates a self-protected thyristor in accordance with yet another embodiment of this invention.

FIG. 3 illustrates a thyristor device in accordance with this invention as would be applied to an edge gated thyristor. The thyristor indicated generally at 90 includes metallized contact 12, anode 14 of p-type conductivity semiconductor material, n-base 16 and p-base 20 all of like composition and function to the similarly numbered layers and contacts of FIGS. 1 and 2. Semiconductor junctions 18 and 22 correspond similarly to the like numbered devices of FIGS. 1 and 2. The arrangement of the gate contacts, pilot emitter, secondary pilot emitter and main emitter of device 90 differs somewhat from FIGS. 1 and 2, and will be described in substantial detail herein. The main emitter of device 90 includes n-type emitter layer 92 overlying p base layer 20. It will be appreciated that n-type emitter layer 92 is a continuous emitter region having a gate region located at an edge thereof rather than centrally as was the case in devices 10 and 60. Cathode metallization 94 overlies n-type emitter layer 92 and forms the cathode terminal of the device. Although not illustrated, it is to be appreciated by those skilled in the art that main emitter region 96 may include emitter shorts, fabricated in a manner well-known to those skilled in the art, extending through n-conductivity type emitter layer 92 to p-type base layer 20.

Gate electrode 98 directly overlies p-type base layer 20 and provides a terminal for the application of a normal gate turn-on voltage to the device. Gate electrode 98 is surrounded by annular pilot thyristor 100, which includes pilot emitter 102 and overlying metallization 104. While thyristor 100 is shown in FIG. 3 as having a generally circular configuration, it will be appreciated by those skilled in the art that other gate structures may advantageously be used in certain semiconductor devices in accordance with this invention, and the invention is not limited to any particular gate geometry. For example, an oval or sausage-shape gate region might readily be employed in a device of the general configuration of device 90, thereby providing somewhat reduced gate area on the device in order to maximize the area of the main SCR region of the device. Similarly, linear gates, rectangular gates, light-sensitive gates, or virtually any other type of gate known in the art may be employed including junction gates. Auxiliary pilot thyristor 106 partially surrounds pilot thyristor 100 and gate electrode 98 effectively isolating the gate region from the main thyristor region 96. Metallization 104 which overlies pilot emitter layer 102 surrounds the device thus providing a long turn-on line for auxiliary pilot thyristor 106 which in turns provides a similarly long turn-on line for main thyristor section 96. Thyristor 90 is provided, as was the case with thyristors 10 and 60, with a beveled edge region. The bevel at the edge of the device serves to increase the breakdown voltage. It will be appreciated, however, that the breakdown voltage of a device of the type illustrated in FIG. 3 will nevertheless be lower and, in fact in accordance with this invention, should be lower at the edge of the device and anywhere else in the device. It will be apparent by reference to FIG. 3 that leakage currents which begin to flow at the onset of avalanche breakdown and which may be expected to flow at the edge of the device may turn the device on in one of two ways. Should the leakage currents begin to flow under the gate region 98, the device will be turned on by the action of pilot thyristor 100 and then auxiliary pilot thyristor 106 acting sequentially to turn on main thyristor section 96. Should large leakage currents first flow outside of pilot thyristor 100, main thyristor section 96 will be turned on by the action of auxiliary pilot thyristor 106 alone. In either event, the turn on will occur in a controlled manner, thus preventing destructive avalanche voltage breakdown.

Figure 4:
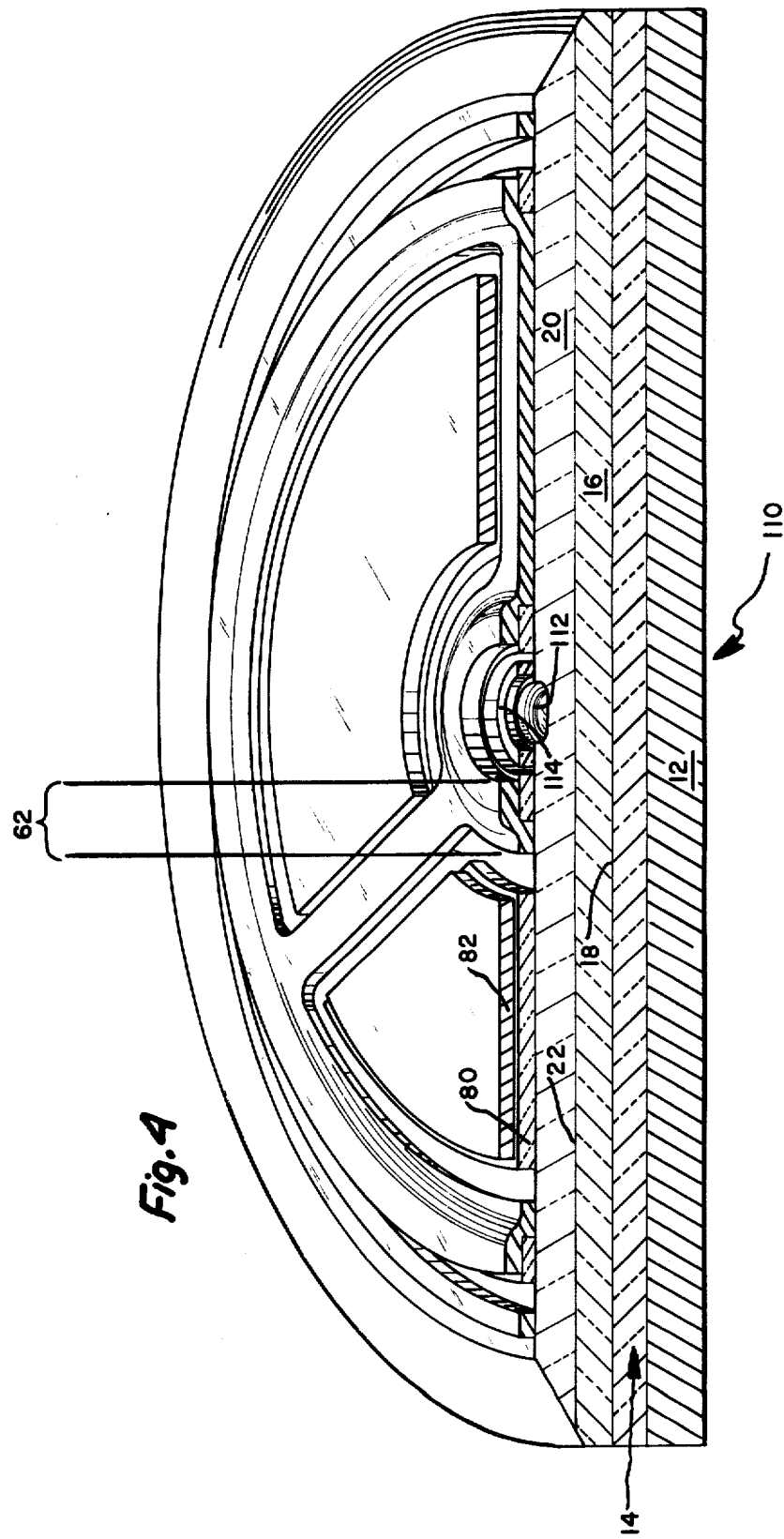
FIG. 4 illustrates a self-protected thyristor in accordance with still another embodiment of the invention.

FIG. 4 illustrates an embodiment of this invention similar to that illustrated in FIG. 2, but adapted for light-triggering of the device. The thyristor, indicated generally at 110, includes substantially all of the elements of thyristor 60 of FIG. 2 and like numbered elements perform similar functions. A conductive electrical contact 12 is provided having semiconductor layers 14, 16 and 20, in that order, overlying electrode 12 and forming semiconductor junctions 18 and 22 therebetween. Layers 14, 16 and 20 are of p-type, n-type and p-type semiconductor materials, respectively. Light-sensitive gate region 112 extends from the surface of p-type semiconductor layer 20 down into layer 20 towards, but not meeting, junction 22. It is desirable in accordance with this invention that the depth of light-sensitive region 112 be sufficient to provide for the ready generation of carriers proximate to junction 22 and the presence of triggering radiation impinging upon light-sensitive area 112. Electrical contact 114 of generally annular characteristics surrounds light-sensitive area 112 and provides for the uniform turn on of pilot thyristor region 62. Annular ring 114 is optional in accordance with this invention and may be dispensed with where desired. Light-sensitive region 112 is formed, as is well-known to those skilled in the art, and may, if desired, be passivated, polished, or treated in any other way tending to improve its effectiveness. The precise characteristics of light-sensitive region 112 may be varied by those skilled in the art without departing from the true spirit and scope of this invention. Pilot thyristor 62 is surrounded by the main thyristor portion of device 110 including n-type emitter layer 80 and electrical contact 82 thereover. The main emitter may conveniently be provided with emitter shorts therein of the type illustrated, for example, at 116. Emitter shorts are well known in the art and it will be appreciated that electrical contact 82 is ohmically connected to p-type semiconductor layer 20 through n-type emitter region 80 at localized points in the emitter. The construction and function of emitter shorts are well known and form no part of this invention, except insofar as they are compatible herewith and may be advantageously employed in the device in accordance with this invention. The remainder of device 110 is substantially identical to device 60 of FIG. 2 and a description of device 60 may be applied to device 110.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A self-protected semiconductor device comprising:
   a main thyristor section;
   a pilot thyristor section operatively associated with said main thyristor section to turn on said main thyristor section when said pilot thyristor section is turned on,
   first gate means operatively associated with said pilot thyristor section for turning said pilot thyristor section on in response to the application of a gate signal to said gate means;
   an auxiliary pilot thyristor section surrounding said main thyristor section for turning on said main thyristor section when said auxiliary pilot thyristor section is turned on;
   second gate means surrounding said auxiliary pilot thyristor section for turning on said auxiliary pilot thyristor section in response to leakage currents generated at the onset of avalanche voltage breakdown of the device.

2. The device of claim 1 further comprising
   means electrically connecting said pilot thyristor section and said auxiliary pilot thyristor section.

3. The device of claim 1 wherein first gate means comprises radiation sensitive gate means.

4. The device of claim 1 wherein said first gate means comprises:
   electrode means inside said pilot thyristor section.

5. The device of claim 2 wherein said means electrically connecting said first pilot thyristor section and said auxiliary pilot thyristor section comprises electrode means extending from said pilot thyristor through said main emitter section to said auxiliary pilot thyristor and forming a turn-on area in said main thyristor section adjacent said electrode means.

6. The device of claim 5 wherein said electrode means comprises at least two electrodes extending from said pilot thyristor to said auxiliary pilot thyristor.

7. The device of claim 1 wherein said pilot thyristor section and said first gate means are located generally on an edge of said device.

8. The device of claim 7 wherein said pilot thyristor and said auxiliary pilot thyristor are arranged as a double amplifying gate structure, said pilot thyristor comprising a first amplifying gate and said auxiliary pilot thyristor comprising a second amplifying gate.

9. The device of claim 8 wherein said pilot thyristor is a radiation sensitive thyristor.

10. In an amplifying gate thyristor of the type including a main thyristor section and a pilot thyristor section operatively associated therewith for turning on said main thyristor section in response to a turn on signal applied to a gate region of said pilot thyristor section; the improvement comprising:

an auxiliary pilot thyristor disposed peripherally to said main thyristor section, said auxiliary pilot thyristor including auxiliary gate region means responsive to edge leakage currents generated at the onset of avalanche voltage breakdown of said amplifying gate thyristor, to turn on said auxiliary pilot thyristor thereby turning on said main thyristor and protecting said device from destructive breakdown.

11. The device of claim 10 further including
means electrically connecting said pilot thyristor and said auxiliary pilot thyristor so that when either turns on the other is activated to turn on said main thyristor section.

12. The device of claim 11 wherein said means electrically connecting said pilot thyristor and said auxiliary pilot thyristor comprises conductive electrode means integrally formed with said device.

13. The device of claim 11 wherein said pilot thyristor is substantially surrounded by said main thyristor section.

14. The device of claim 13 wherein said means electrically connecting said pilot thyristor to said auxiliary pilot thyristor comprises electrode means extending radially outward from said pilot thyristor to said auxiliary pilot thyristor.

* * * * *